United States Patent
Shabib et al.

(10) Patent No.: US 7,203,879 B2
(45) Date of Patent: Apr. 10, 2007

(54) BUILT-IN-TEST DIAGNOSTIC AND MAINTENANCE SUPPORT SYSTEM AND PROCESS

(75) Inventors: Hashim M. Shabib, Hanover Park, IL (US); Richard D. Woods, Wonder Lake, IL (US)

(73) Assignee: Northrop Grumman Corporation, Los Angeles, CA (US)

(*) Notice: Subject to any disclaimer, the term of this patent is extended or adjusted under 35 U.S.C. 154(b) by 404 days.

(21) Appl. No.: 10/874,620

(22) Filed: Jun. 22, 2004

(65) Prior Publication Data

US 2005/0283694 A1    Dec. 22, 2005

(51) Int. Cl.
*G01R 31/28* (2006.01)

(52) U.S. Cl. .................. 714/732; 714/733

(58) Field of Classification Search .............. 714/30, 714/728, 732, 797, 733; 701/29; 382/141; 324/765
See application file for complete search history.

(56) References Cited

U.S. PATENT DOCUMENTS

| | | | | |
|---|---|---|---|---|
| 4,317,199 A | * | 2/1982 | Winslow | 714/30 |
| 4,519,078 A | * | 5/1985 | Komonytsky | 714/728 |
| 4,608,691 A | * | 8/1986 | Lynch | 714/732 |
| 5,051,996 A | * | 9/1991 | Bergeson et al. | 714/732 |
| 5,799,022 A | * | 8/1998 | Williams | 714/797 |
| 6,336,065 B1 | * | 1/2002 | Gibson et al. | 701/29 |
| 6,501,849 B1 | * | 12/2002 | Gupta et al. | 382/141 |
| 7,005,873 B2 | * | 2/2006 | Kim et al. | 324/765 |

\* cited by examiner

*Primary Examiner*—David Ton
(74) *Attorney, Agent, or Firm*—Stetina Brunda Garred & Brucker

(57) ABSTRACT

A diagnostic and maintenance support system and process are provided for performing tests, collecting Built-In-Test (BIT) log data from systems, analyzing fault data, and recommending Shop Replaceable Units (SRU's). The system and process include uploading and reading a retrieved fault signature from a BIT log retrieved from a subject system under test. The retrieved fault signature is a serial word composed of a plurality of consecutive bits indicating either a pass or fail. Each bit is assigned to a specific SRU, system level test, or an event. The system and process further include a source code segment for performing a Discrete Fault Mask (DFM) algorithm, a Combinational Fault Mask (CFM) algorithm, and a source code segment for performing a Reserved Fault Mask (RFM) algorithm to identify a list of potentially problematic SRU's if matching bits are not found between the retrieved fault signature and the list of CFM serial words.

43 Claims, 17 Drawing Sheets

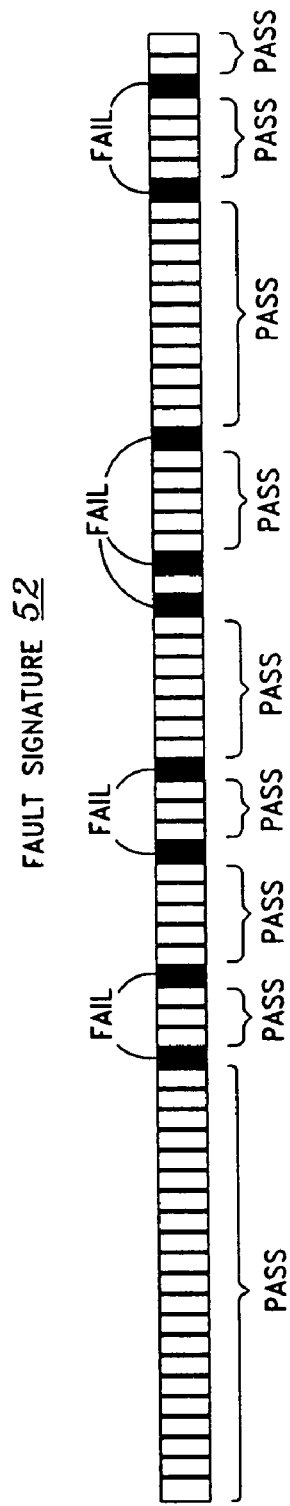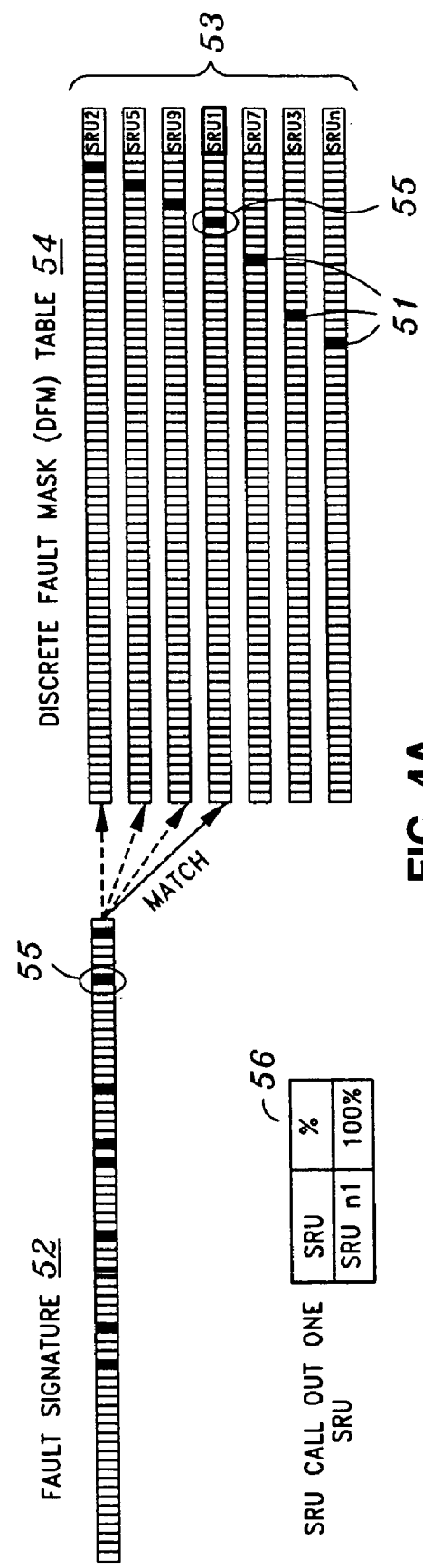

BUILT-IN-TEST DIAGNOSTIC AND MAINTENANCE SUPPORT SYSTEM AND PROCESS

STATEMENT RE: FEDERALLY SPONSORED RESEARCH/DEVELOPMENT

The present invention was made under U.S. Government Contract No. N00140-00-C-M526.

CROSS-REFERENCE TO RELATED APPLICATIONS

Not Applicable

BACKGROUND OF THE INVENTION

1. Field of the Invention

The present invention relates to diagnostic and maintenance support systems used to diagnose data from BIT processes. In particular, the present invention relates to diagnostic and support applications (e.g. software and/or embedded circuitry) that performs tests on systems, collects Built-In-Test (BIT) log data from the systems, analyzes fault data, and recommends Shop Replaceable Units.

2. Background of the Invention

Built-In Tests (BIT's) are self-contained diagnostic tests included within typically highly sophisticated systems, such as are the electronic of an aircraft. BITS are included into/or affiliated with systems to perform self-diagnostic troubleshooting routines to identify failures within the system itself. Most BITS are now contained in software and/or embedded circuitry within or affiliated with the system. To retrieve BIT data from the system (such as an aircraft), the data may be read directly from the system's displays by the operator; data may be transmitted by telemetry; or ground support equipment (GSE) and/or automatic test equipment (ATE) may be connected to the system and the BIT log data stored in the system's non-volatile memory may be retrieved.

As military flight hardware becomes more sophisticated, BITS must be able to provide mission-oriented information (e.g., system readiness, functional failure, failure criticality, capability remaining), as well as maintenance-oriented information (system operational status, fault detection and isolation, storage of test data, verification of repairs). In other words, the more sophisticated the BITS are, the more data is available to be analyzed.

Traditional GSE and ATE test equipment have been relatively effective for systems in the last 15 years, but they tend to be primitive, inadequate, and unreliable. In particular, most currently available test equipment has not been designed to meet aggressive service and turn around schedules now mandated by the military. For instance, several aircraft electronic warfare systems now are designed to use no flight line test equipment at all. Instead, BITS may be all that are used to determine the health of the systems.

To be able to handle ever increasing and more comprehensive BIT information requirements, the GSE and/or ATE must provide applications which are capable of effectively processing large amounts of BIT information, managing and sorting the information, and analyzing the information using much more sophisticated algorithmic techniques. Moreover, there are increasing demands to provide even more intelligent but simpler and less expensive GSE and/or ATE, which compose of less test hardware, while at the same time reduces test and repair times, and minimizes operator skill level.

It would be advantageous to provide a BIT diagnostic and maintenance support system and process which is quick, reliable, simple and inexpensive. Preferably entire systems could be rapidly tested between thirty seconds and two minutes. Furthermore, it would be advantageous to provide a test set with a BIT process which would have minimal training requirements and of which could be conducted by technicians having minimal expertise on the system under test.

BRIEF SUMMARY OF THE INVENTION

The present invention (herein also referred to as "BITPRO") is a diagnostic and maintenance support application that allows the user to test an applicable system, collect built-in-test (BIT) log data stored in non-volatile memory, analyze fault data, and provide a list of shop replaceable unit (SRUs) ranked by the SRU most likely causing the indicated failure. The BITPRO system provides three major functions, including a diagnostic function, a support function, and maintenance and diagnostic function.

The present invention provides a BIT process which is quick, reliable, simple, and inexpensive. Benefits include rapid testing (thirty seconds to two minutes); operational by a low-skill, one-person interface; automatic fault detection and isolation; and less support equipment and training requirements. Additional information from the BIT log data can be retrieved, enabling the user to understand the condition.

The present invention has several advantages and benefits that the prior art such as GSE or ATE, does not offer. BITPRO is designed to deal with problems associated with conventional test methods. One aspect of the BITPRO system is its ability to provide complete support. The present invention has the capability to test, detect and isolate faults and verify repairs. For instance, BITPRO performs vertical testing. This is an improvement over the prior art because failures detected by BIT in the field may not be detectable by a Test Program Set (TPS). The present invention also provides real-time functional testing not viable with standard ATE. Also, embedded functions are usually more visible to BIT and less visible to ATE, which interface through functional and test connectors. Further, BITPRO makes use of same functional testing processes used at the operational level. This reduces the potential for "Can Not Duplicate" (CND) results. Moreover, complete diagnosis can be performed by the present invention in a few minutes while ATE takes much more time to diagnose the LRU.

The present invention is also very portable in regards to hardware. An exemplary BITPRO system may comprise of a personal computer (PC), interface fixture, and a cable set which can be easily transported to support the user. The present invention is much more portable as compared to ATE equipment which is usually much heavier and requires support facilities.

Additionally, the cost of BITPRO is much less than the cost of a typical ATE. As mentioned, BITPRO makes use of same functional testing processes used at the operational level. While on the other hand, ATE requires TPS software to test the system while BITPRO uses Operational Flight Program (OPF) BIT as its main TPS. Modifying TPS software to accommodate improved Operational Flight Program tests may take many months while BITPRO can perform with a new OFP soon after its release. Other cost saving factors can be realized in the reduction of maintenance cost, technical manuals, spares, training, manpower, and skill requirements.

Other exemplary embodiments and advantages of the present invention may be ascertained by reviewing the present disclosure and the accompanying drawings.

BRIEF DESCRIPTION OF THE DRAWINGS

The present invention is further described in the detailed description that follows, by reference to the noted drawings by way of non-limiting examples of preferred embodiments of the present invention, in which like reference numerals represent similar parts throughout several views of the drawings, and in which:

FIG. 3 depicts an exemplary Fault Signature, according to an aspect of the present invention;

FIG. 4A shows an exemplary DFM Comparison algorithm, according to an aspect of the present invention;

FIG. 7 represents an exemplary Reserve Fault Mask Table, according to an aspect of the present invention;

FIG. 10 is a screen shot of an exemplary Measurement Detail tab, according to an aspect of the present invention;

FIG. 13 is a screen shot of a Maintenance Actions feature, according to an aspect of the present invention;

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Overview of the Present Invention (BITPRO)

The present invention (herein also referred to as "BITPRO") is a diagnostic and maintenance support system and process 2 that allows the user to test an applicable system, collect built-in-test (BIT) log data stored in non-volatile memory, analyze fault data, and provide a list of shop replaceable unit (SRUs) ranked by the SRU most likely causing the indicated failure. The BITPRO system provides three major functions, including a diagnostic function, a support function, and maintenance and diagnostic function.

Figure 1:
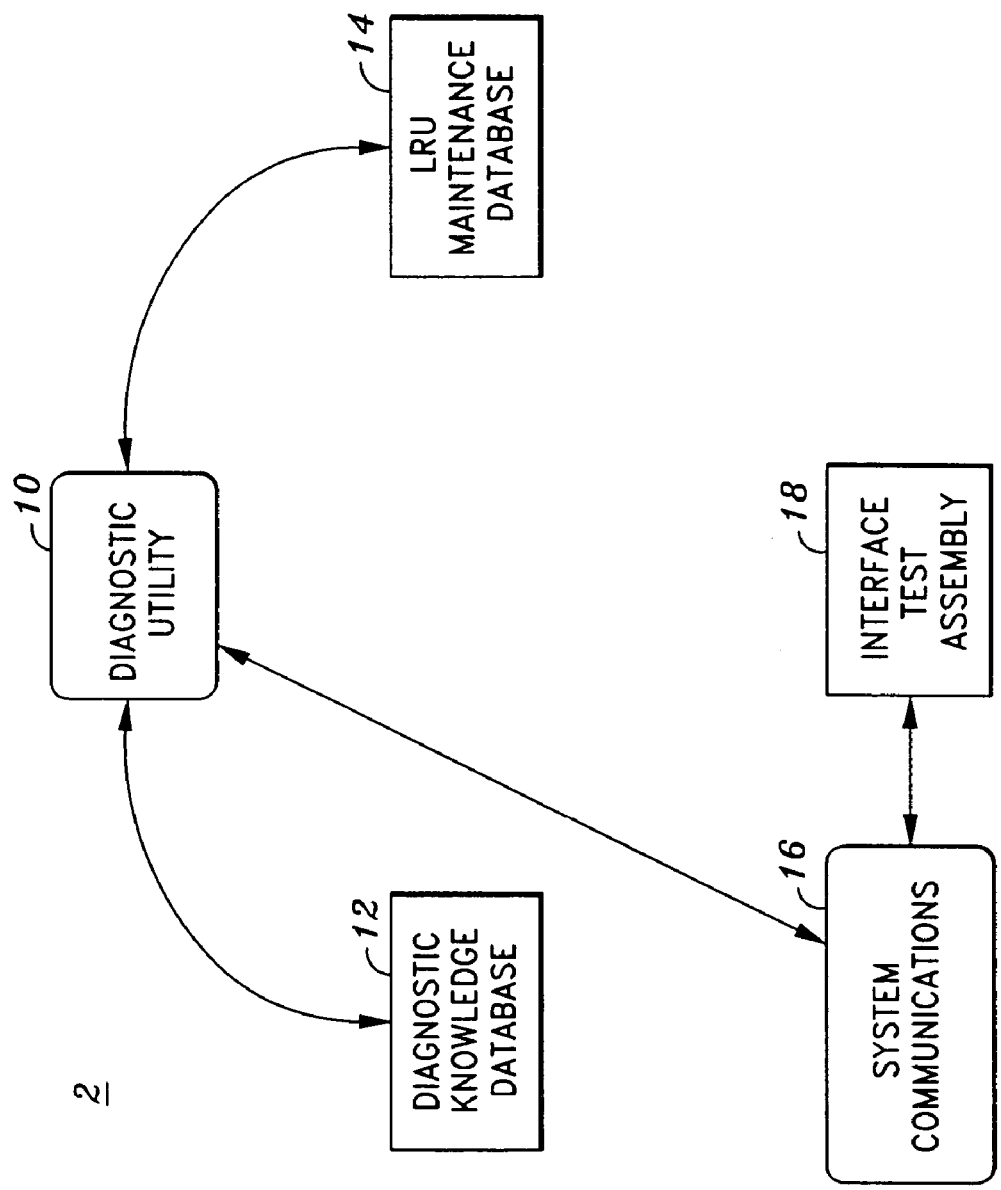
FIG. 1 shows a general schematic of the BITPRO Diagnostic and Maintenance Support System, according to an aspect of the present invention.

As schematically depicted in FIG. 1, BITPRO 2 comprises a diagnostic utility 10 that refers to a Diagnostic Knowledge Database (DKD) 12 and a Line Replaceable Unit (LRU) Maintenance Database 14. The Diagnostic Utility 10 communicates with the subject system via Systems Communications 16 and Interface Test Assembly 18 (ITA).

The System Communications 16 may use a high speed interface such as Ethernet, MIL-STD-1553, RS-232, RS-422, RS-485, IrDA, USB, ISA, ExCA or any other similar communication protocols known in the art. Moreover, it is appreciated that the System Communications system 16 should not be limited to such standards and protocols for communications and peripheral control. Such standards are periodically superseded by faster or more efficient equivalents having essentially the same functions. Accordingly, replacement standards and protocols having the same functions are considered equivalents.

Figure 14:
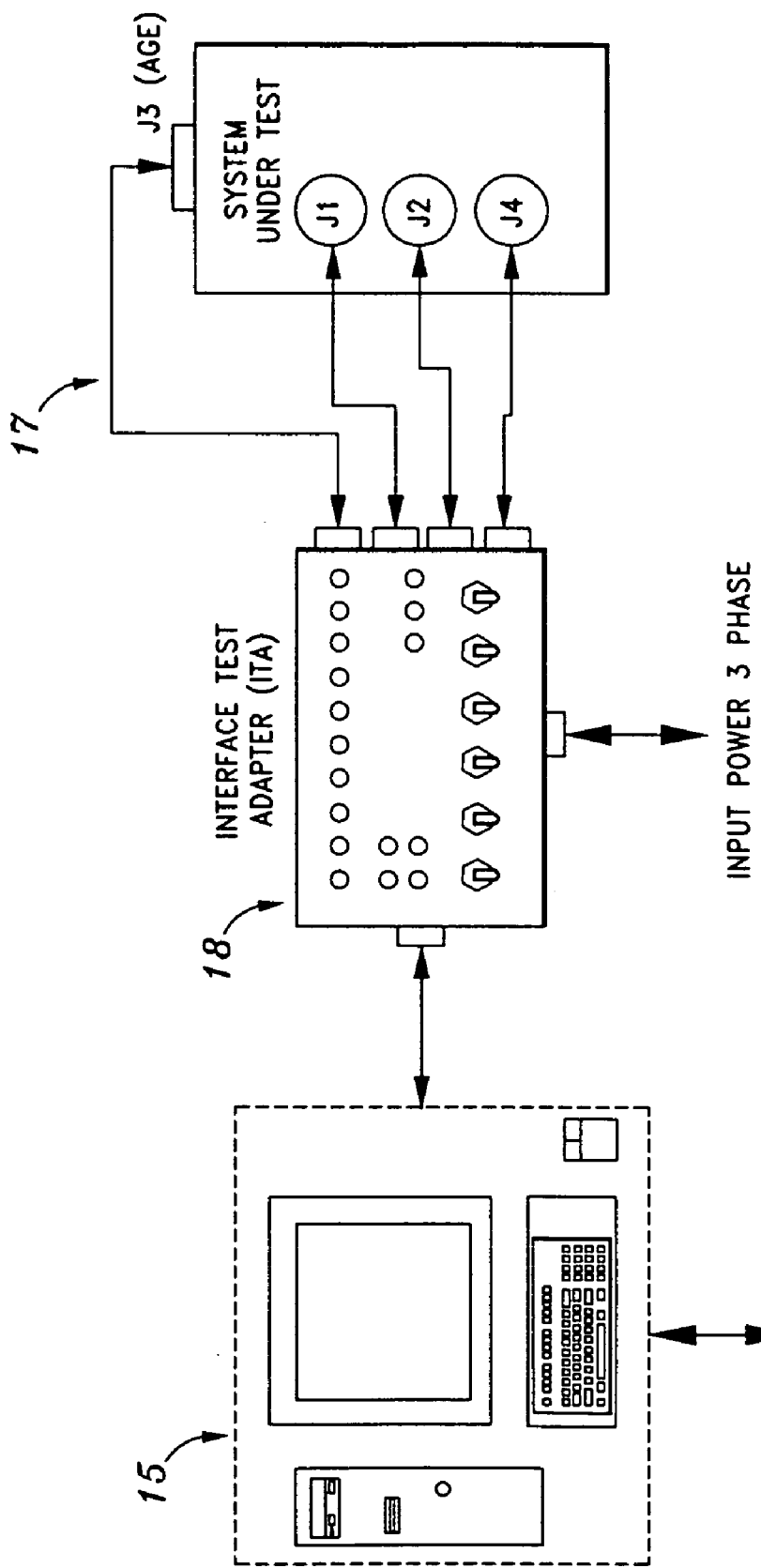
FIG. 14 is diagram of an exemplary hardware configuration, according to an aspect of the present invention.

The present invention is also very portable in regards to hardware. For example, the BITPRO system 2 may be installed as a software application on a personal computer 15. An exemplary hardware configuration is depicted in FIG. 14 which includes a personal computer 15, the ITA 18, and a cable set 17.

The Interface Test Assembly 18 (ITA) may include a plurality of switches, relays, LED indicators, and in some cases a circuit card necessary to implement the required functionality. Features of an exemplary ITA 18 which is used to provide power, communication, control, and status monitoring to the user as shown in Table 1 below.

TABLE 1

| | |
|---|---|
| Power | 3 Phase 115 VAC 400 Hz |
| | 28 VDC |
| Communication | RS-232 Serial communication to the PC |
| Control | Mode Select (Receive, Transmit, Stand By) |
| | Operate/GSE Mode (Maintenance) |
| | Boot Enable |
| | Reset |
| | BIT, run BIT (Operate Mode Only) |
| LED Status Indicators | 28 VDC, ±15 VDC, ±5 VDC, 3.3 VDC, and 2 VDC |
| Load | RF xxx Watt resistive load |

Figure 15:
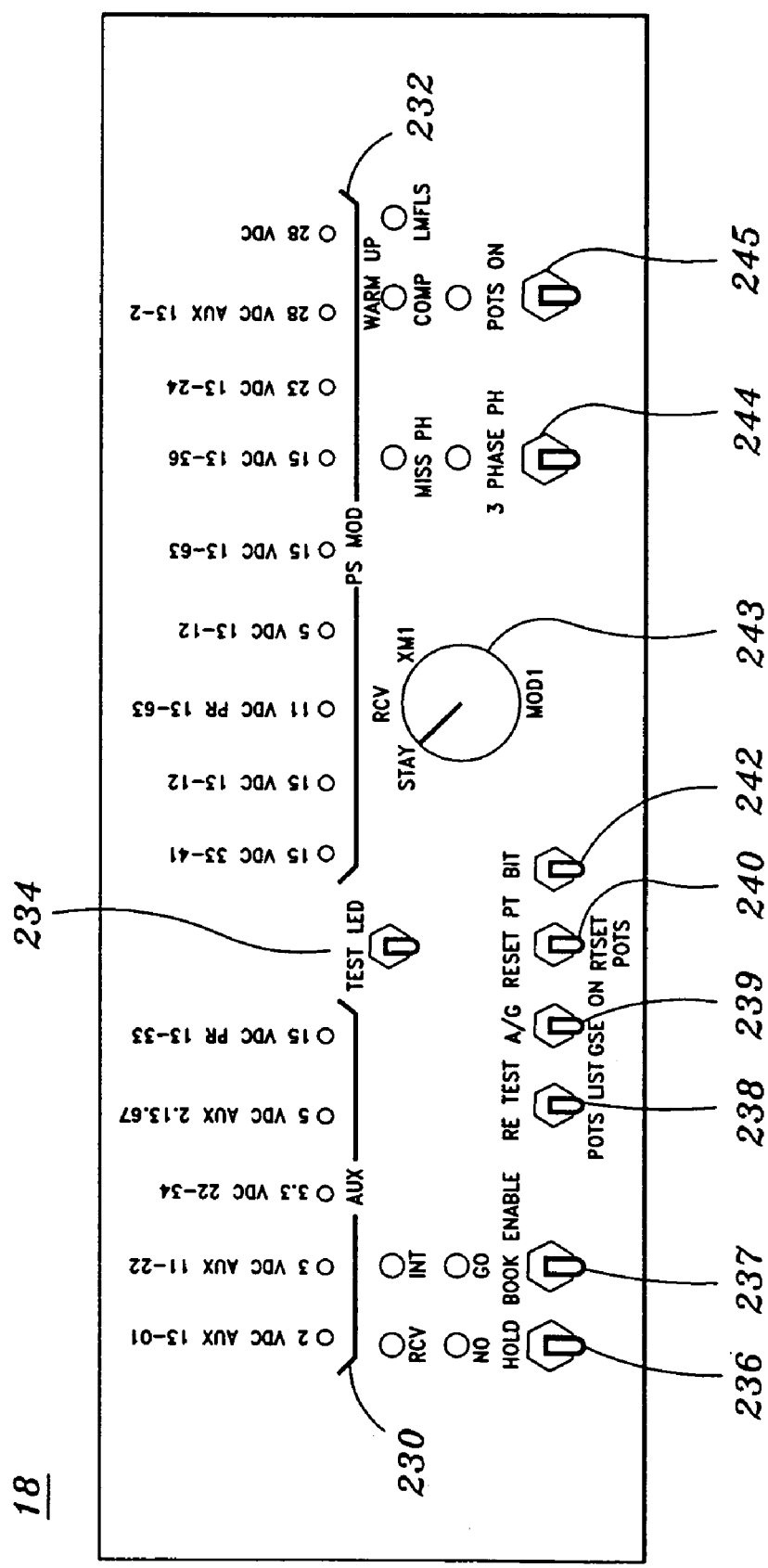
FIG. 15 depicts the control panel of an exemplary Interface Test Adaptor.

The control panel of an exemplary ITA 18 is depicted in FIG. 15. The ITA 18 control panel may include a series of AUX LED's 230, a series of PS MOD LED's 232, and numerous other LED indicators such as RCV, XMT, NO, GO, MISS PH, 3 Phase On, Warm Up Complete, LV FLT, 3 Phase On, POTS On. Furthermore, the ITA control panel may include numerous toggles switches dedicated to various functions including, Test LED 234, Hold 236, BOOT Enable, 237, RT Test/POTS Test 238, A/C-GSE On 239, Reset RT-Reset POTS 240, BIT 242, 3 Phase On 244, and POTS On 245. Moreover, a Mode selection switch 243 is provided which may be positioned on STBY (standby), RCV (receive) or XMIT (transmit).

An exemplary cable set 17 which may be used the present invention includes a serial communication cable from the PC 15 to the ITA 18, a control signal cable, a monitoring and support signals cable, a power cable (115 VAC 400 HZ), and an RF cable (from system to dry load in the ITA).

One feature of the present invention is that it utilizes uses a Fault Signature (FS) algorithm which is an effective method to diagnose failures at the LRU maintenance level. An exemplary Fault Signature, as shown in FIG. 3, is a long serial word. Each bit is assigned to a specific SRU or a system level test. When populated with passing and failing tests, the Fault Signature can be compared against the Diagnostic Knowledge Database 12 where a match will lead to the faulty SRU.

Additionally, the BITPRO system 2 is also capable of loading system operational software to LRU non-volatile memory. For instance, BITPRO 2 can provide the user with the ability to update LRU specific information stored in non-volatile memory. BITPRO 2 may also set Serial Number (S/N), time reference and/or digital estimated time indicators, and 1553 Receive/Transmit Addresses. This Option may be unique to a specific system, the communication bus controller (usually the aircraft main computer) communicates with various equipment over the 1553 bus. Only equipment with the right address would receive and respond to data from the bus controller. Since the system can be used in different aircraft it is necessary to assign a unique address to avoid conflicts. For example, addresses may be any where between 0 and 31. The present invention may also retrieve BIT log data, display failed tests, export BIT log data to text files, and print BIT log data.

BITPRO provides the user with other support functions like the ability to upload BIT log data, clear BIT log, and download Operational Flight Programs (OFP), a User Data File (UDF), and BOOT which basic low level software that is necessary to start a main computer (which is equivalent to IBM PC BIOS). The aforementioned features will be further discussed and elaborated later in the specification.

Also, the BITPRO system 2 provides hyperlinks to technical manual instructions and a link to the failed test description in the Test Definition Requirements (TDR) document. For example, the BITPRO system 2 provides hyperlinks to SRU remove and replace instructions provided in affiliated technical manuals. Each failed test displayed from the BIT log may also be linked to the TDR to assist the user in maintaining the system.

Moreover, the present invention allows tracking of all repair and configuration data for the deployed systems. Repair data is automatically used to refine the Diagnostic Knowledge Database 12, the LRU Maintenance Database 14 and to update LRU configurations. Databases between sites can be integrated together by using import and export features, which allow the application from one site to incorporate data from other sites.

The following aforementioned features and other will now be discussed in greater details and described according to the Figures. In particular, first the exemplary BITPRO process 2 is discussed. Next, an exemplary Diagnostic Knowledge Database (DKD) 12, exemplary Fault Signature (FS) 52 (see FIG. 3), an exemplary Discrete Fault Mask (DFM) algorithm 54 (see FIG. 4A), an exemplary Combinational Fault Mask (CFM) 58 algorithm (see FIG. 4B), an exemplary Reserved Fault Mask (RFM) table 62 (see FIG. 7) and algorithm 65 (see FIG. 8) are fully described. Then other BITPRO system 2 features are discussed, including exemplary BITPRO Menu Bar and Buttons features 70 (see FIG. 9), an exemplary BIT Log Tab 100 (see FIG. 9), exemplary Measurement Detail Tab 140 (see FIG. 10), and exemplary Support Menu Tab 150 (see FIGS. 11A–C), and an exemplary Configuration Tab 190 (see FIG. 12).

An Exemplary BITPRO Process

Figure 2:
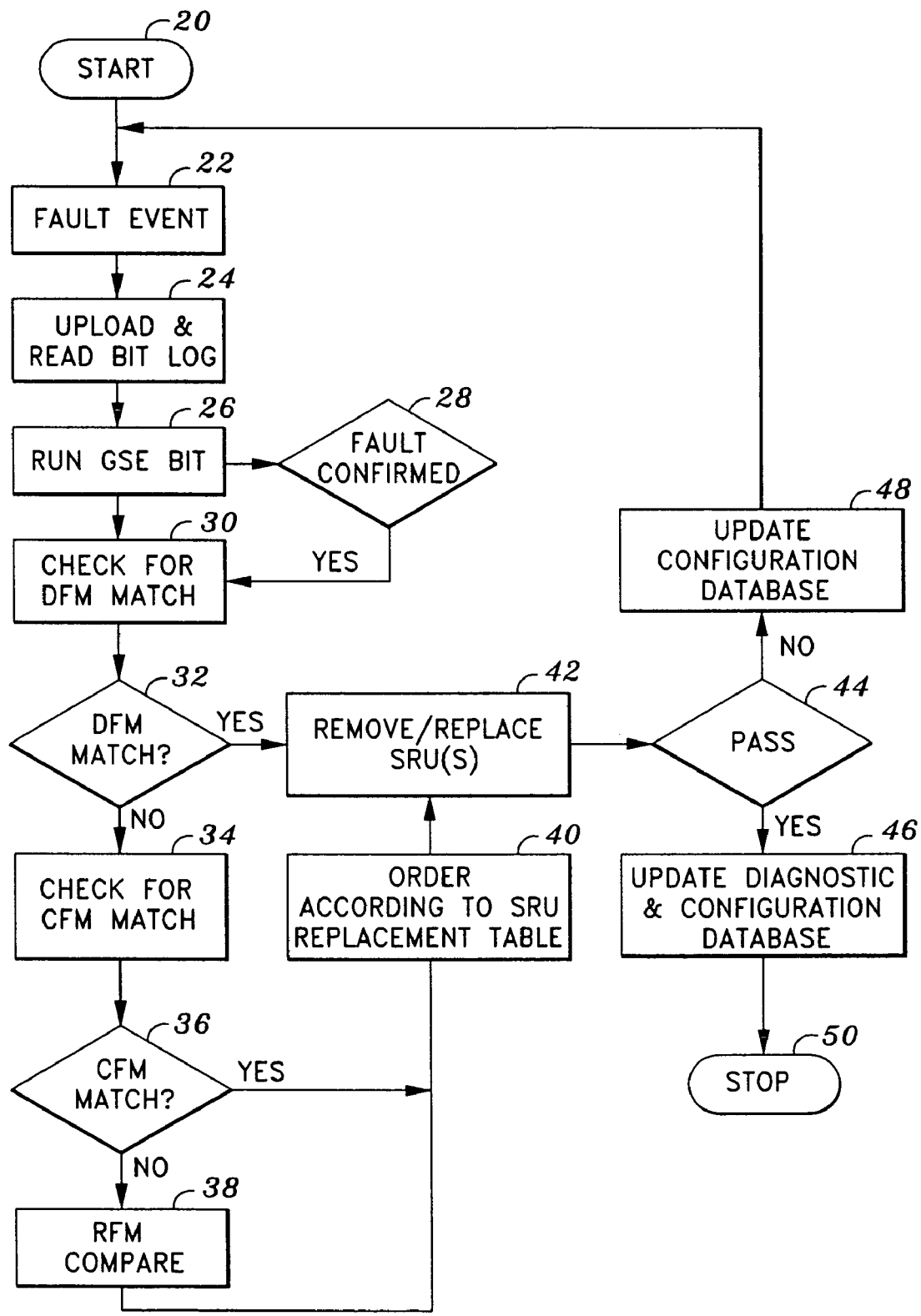
FIG. 2 is an exemplary flow diagram of the BITPRO Diagnostic and Maintenance Support System, according to an aspect of the present invention.

An exemplary BITPRO diagnostic process 2 is flow diagrammed in FIG. 2. At 20, the BITPRO process 2 is initiated. At 22, an occurrence of a fault event occurs in the subject system. At 24, the BIT Log from the subject system is uploaded and read to the BITPRO system 2. Here the Fault Signature 52 is retrieved from the subject system under test. The ITA 18 can run the BITPRO system 2 in one of two modes. A first is referred to as Operational Mode where a BIT would run upon turning on the system or by using a momentary switch to initiate a BIT after warm up is completed. The second mode is GSE mode where BIT can be run only when commanded through the BIT Pro menu, and in which the GSE/Operate switch has to be set to GSE. At 28, if a GSE fault event is confirmed then through GSE mode, the operator can initiate a BIT and upload the BIT log again and then compare the two files if there is a match, then a failure/fault is confirmed. If not, then at 30, a check is performed for a DFM match using the DFM Table and algorithm 54. At 31, if a DFM match is found at 32, then at 42 an identified SRU(s) may be removed and replaced. If no, then at 33 a check for a CFM match is performed at 34 using the CFM Table and algorithm 58. If at 35, a CFM match is found at 36, then an order according to an SRU replacement table is implemented at 40. If not at 37, then at 38 a RFM comparison is performed using Reserve Fault Mask Table 62 and Reserve Fault Mask Process 65. After the RFM comparison is performed at 38, then an order according to the SRU replacement table is implemented at 40. Once the order is implemented at 40, then at 42 the identified SRU(s) are removed and replaced. At 44 a BIT test is performed to verify that the system under test is now functioning properly. If the system under test is now functioning properly at 44, then the Diagnostic Knowledge Database 12 and LRU Maintenance Database 14 are updated. Then at 50, the BITPRO process 2 stops. If at 44, the system under test still has problematic symptoms, then the configuration database is updated at 48 because the configuration changes when SRUs are swapped even if it does not fix the problem. Then at 22, the process returns back the beginning of the BITPRO process 2 and is repeated again.

An Exemplary Diagnostic Knowledge Base (DKB)

As shown in FIG. 1, the BITPRO system 2 includes a database or a plurality of databases including the Diagnostic Knowledge Database (DKD) 12 and the LRU Maintenance Database 14. In general, repair data input to the aforementioned databases is used to refine fault isolation resolution algorithms.

Figure 7:
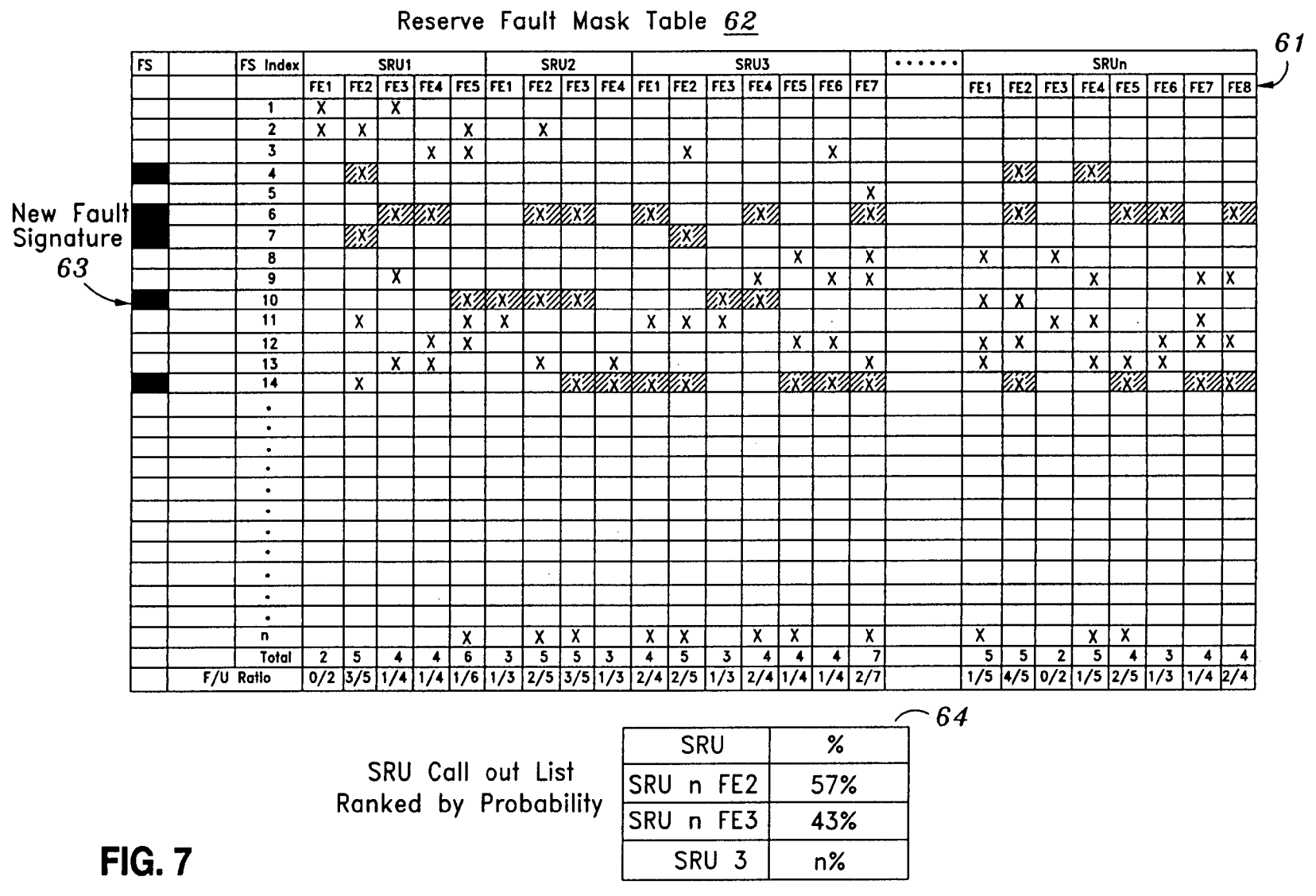

The Diagnostic Knowledge Database (DKD) may include a Discrete Fault Mask (DFM) Table 54 (see FIG. 4A), a Combinational Fault Mask (CFM) Table 58 (see FIG. 4B), and a Reserved Fault Mask (RFM) Table 62 (see FIG. 7). The following features will now be further explained and elaborated in the proceeding sections.

An Exemplary Fault Signature

FIG. 3 depicts an exemplary Fault Signature (FS) 52 which is a serial word composed of a plurality of consecutive bits. Each bit is assigned to a specific SRU, system level test, or other event. The Fault Signature 52 may be retrieved from the subject system under test via various data communications method well-known in the art. A retrieved Fault Signature 52 will be populated with passing and failing tests. For instance, passing tests may be represented by a "0" and failing tests may be represented by a "1". Once the Fault Signature 52 is retrieved from the system under test it is then compared to the Discrete Fault Mask (DFM) Table 54, the Combinational Fault Mask (CFM) Table 58, and a Reserved Fault Mask (RFM) Table 62. The process in which the retrieved Fault Signature 52 is compared to the aforementioned tables is now herein discussed below in the following sections.

An Exemplary Discrete Fault Mask (DFM) Algorithm

The present invention includes a Discrete Fault Mask (DFM) algorithm which compares a Fault Signature 52 to a Discrete Fault Mask (DFM) Table 54 as shown in FIG. 4A. The Discrete Fault Mask Table 54 (or filter) contains a list of all unambiguous tests 53 which clearly point to and/or identify the specific problematic SRU. The list of unambiguous tests 53 (e.g., SRU 1, SRU 2, SRU 5, SRU 7, SRU 9) are represented by a predetermined Fault Signature 52. In particular, each unique unambiguous test 53 is encoded with a differing bit 55 at a unique bit position in the predetermined Fault Signature. Therefore, each unambiguous test 53 is represented uniquely by the position of the differing bit 55. When the Fault Signature 52 is retrieved from the system under test, it is compared to each unambiguous test 53. When a matching bit 55 is found between the Fault Signature 52 and an unambiguous test 53, the SRU correlated to the unambiguous test 53 with the matching bit 55 is identified as the cause of the failure. An exemplary screen shot displaying a Replacement Recommendation box identifying the isolated problematic SRU is shown in FIG. 5. It is noted that the Discrete Fault Mask algorithm may provide a Call Out box 56 which indicates/displays the identified problematic SRU and the calculated probability that the problematic SRU has been identified. In the case of the Discrete Fault Mask algorithm, when a matching bit 55 is identified, theoretically, it is a 100% chance the proper SRU has been identified.

An Exemplary Combinational Fault Mask (CFM)

Figure 4B:
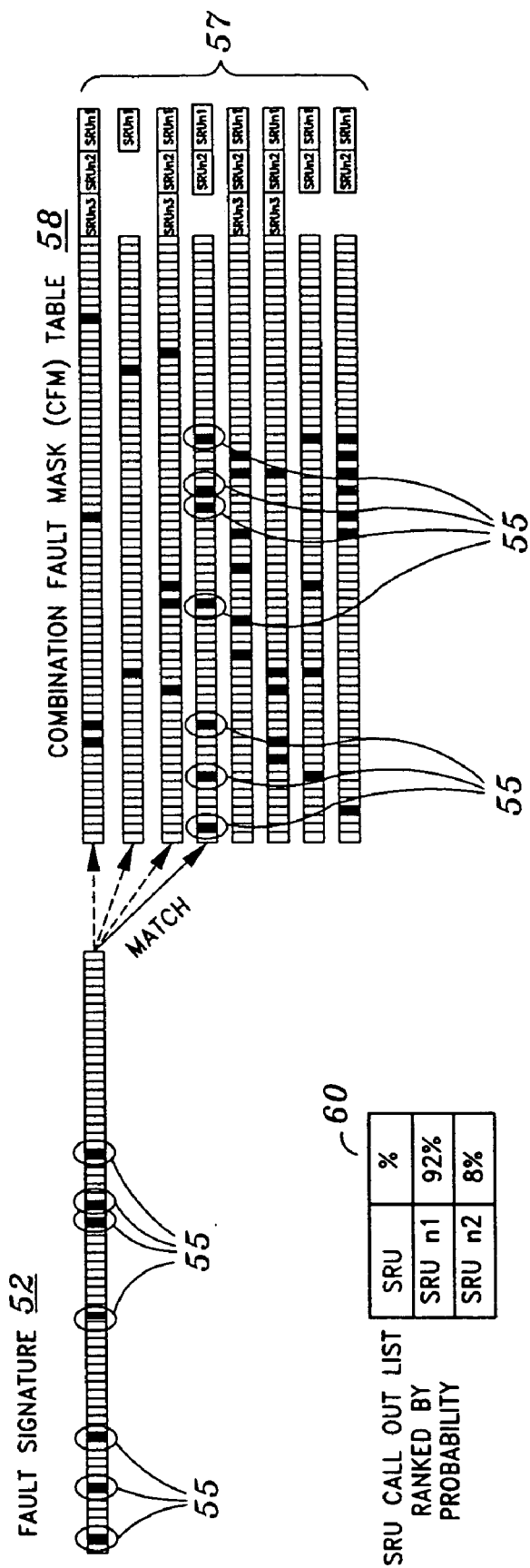
FIG. 4B shows an exemplary CFM Comparison algorithm, according to an aspect of the present invention.
Figure 5:
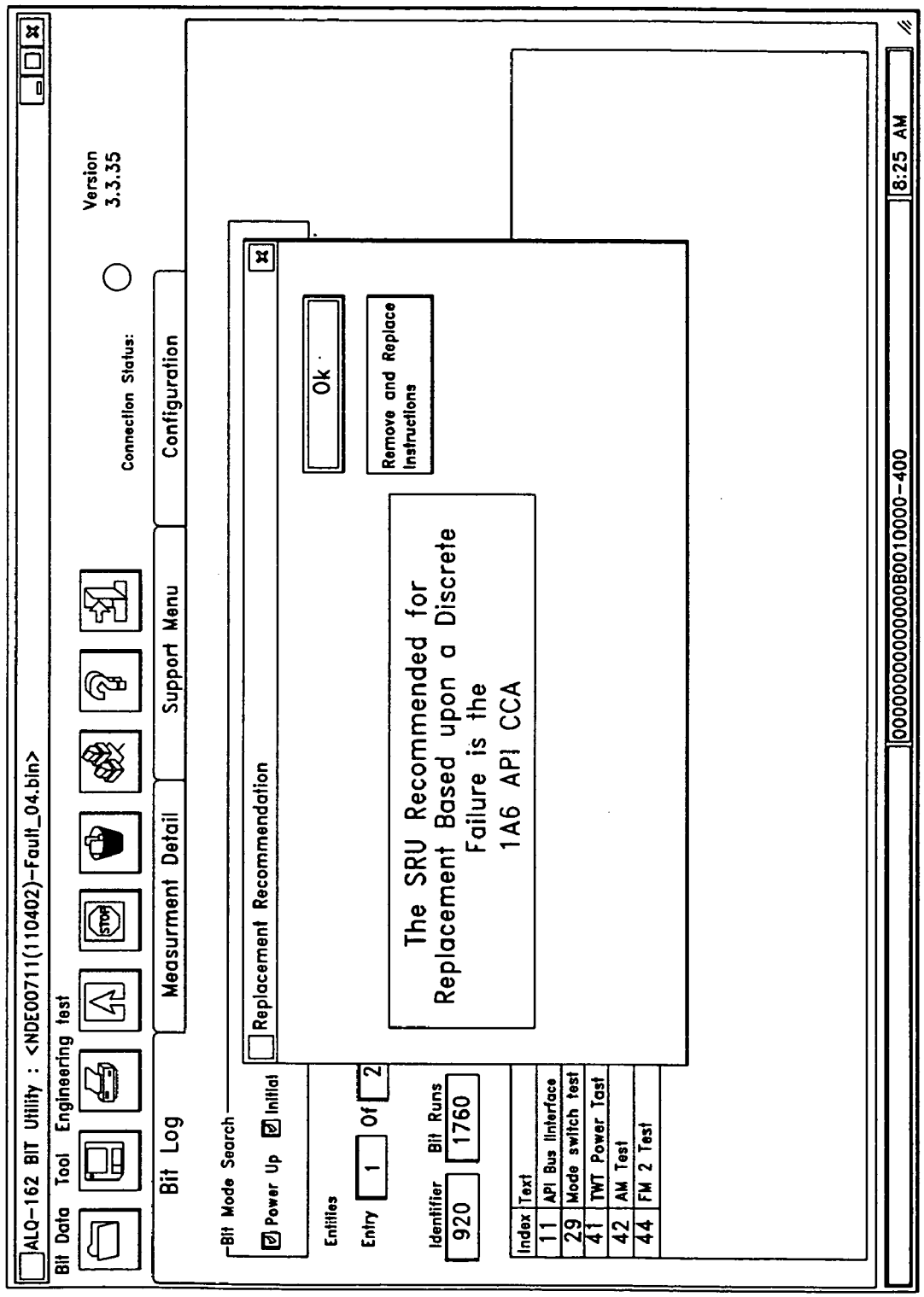
FIG. 5 is a screen shot of a SRU Replacement Recommendation, according to an aspect of the present invention.
Figure 6:
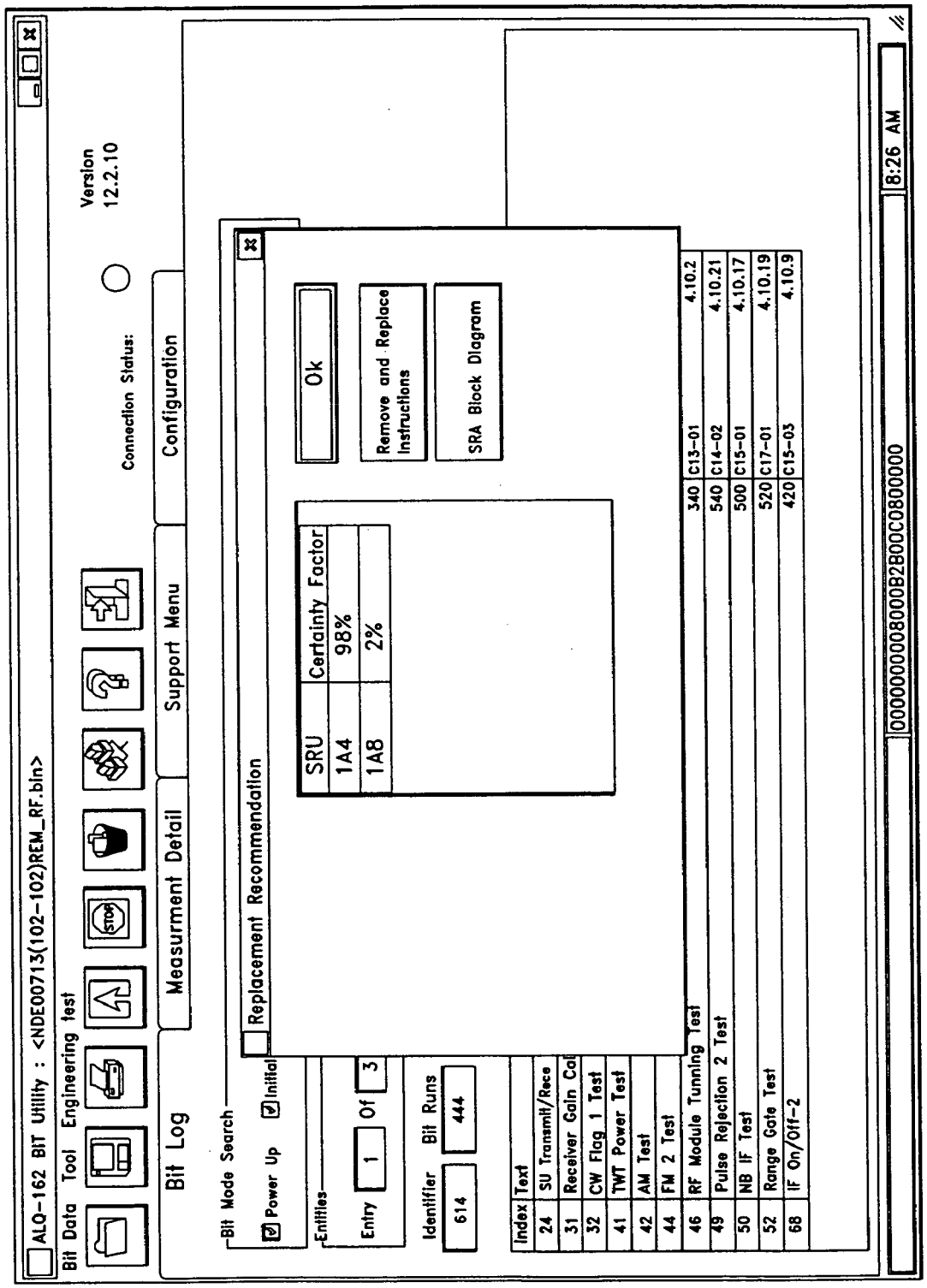
FIG. 6 is a screen shot of a SRU Replacement Recommendation ranked by probability, according to an aspect of the present invention.

The present invention further includes an exemplary Combinational Fault Mask (CFM) algorithm which compares a Fault Signature 52 to a Combinational Fault Mask (CFM) Table 58 is shown in FIG. 4B. The Combinational Fault Mask Table 58 (or filter) contains a list of all ambiguous tests 57 which point to specific SRU's based upon a calculated percentage. The list of ambiguous tests 57 (e.g., SRU n1; or SRU n1, SRU n2; or SRU n1, SRU n2, SRU n3) represent a combination of passing and failing tests. Therefore, each ambiguous test has a plurality of failures. When the Fault Signature 52 is retrieved from the system under test, it is compared to each ambiguous test 57. When a plurality of matching bits 55 are found between the Fault Signature 52 and an ambiguous test 57, the SRU's correlated to the ambiguous test 57 with the plurality of matching bits 55 are displayed as the possible causes of the failure. An exemplary screen shot displaying a Replacement Recommendation box identifying the isolated potential problematic SRU's and the assigned certainty factors (percentage) for each possible problematic SRU is shown in FIG. 6. It is further noted that the Combinational Fault Mask algorithm may provide an SRU Call Out List 60 which lists the potential problematic SRU's and the calculated probabilities (or certainty factors) that the SRU is the problem. The SRU Call Out List 60 will produce a list of one or more candidate SRU's that are identified as the possible cause for the failure mode. The SRU's may be listed in ascending order with the most likely candidate appearing at the top of the list as shown in FIGS. 4B and 6.

An Exemplary Reserved Fault Mask (RFM)

Figure 8:
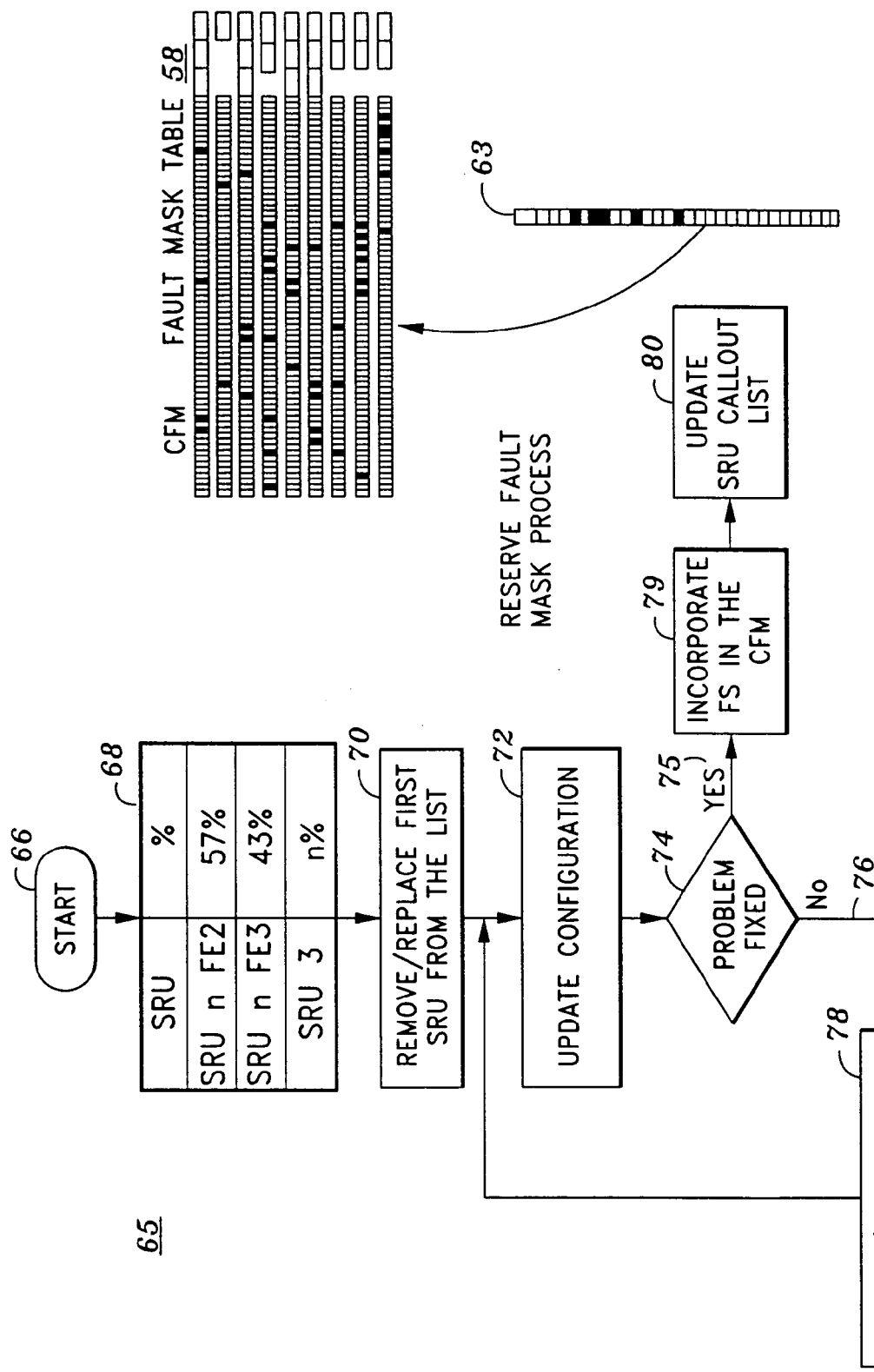
FIG. 8 is a flow diagram of an exemplary Reserve Fault Mask Process, according to an aspect of the present invention.

The present invention further includes an exemplary Reserved Fault Mask (CFM) algorithm or process 65 as shown in FIG. 8 which utilizes an exemplary Reserve Fault Mask Table 62 as shown in FIG. 7. The Reserve Fault Mask Table 62 contains a list of Functional Elements (FE) [see 61; "FE1", "FE2", "FE3", "FE4", "FE5", . . . ]. A Functional Element is any component or a group of components that can perform a unique function that produces a unique Fault Signature (FS) within a specific SRU. Each SRU is represented by a number of FE's wherein each FE has a unique identifier (e.g., "FE1", "FE2", "FE3", "FE4", "FE5") and a list of indexed tests. A Fault Signature 52 that is compared to the DFM Table 54 and the CFM Mask Table 58 filters without a match is processed in the RFM 62 by comparing failed tests to tests associated with each FE. A "fail to use" ratio is then established for each FE. A SRU Call Out list 64 is produced which ranks the SRU's with a FE having the highest fail to use ratio as shown in FIG. 7.

The Reserve Fault Mask Process 65 flow diagrammed in FIG. 8 is now discussed herein below. At 66 the Reserve Fault Mask Process 65 is initiated. At 68, the SRU Call Out list 64 which ranks the SRU's with a FE having the highest fail to use ratio (from FIG. 7) is obtained. At 70, the first SRU (i.e., "SRU n FE2") from the SRU Call Out list 64 is removed and replaced from the problematic system. At 72, the configuration is updated because the configuration changes when an SRU is swapped with a new one even if it does not fix the problem. At 74, a test is performed on the problematic system to determine whether the problem is fixed. If the test results indicate that the problem has not been fixed at 76, then the next SRU (i.e., "SRU 2 FE3") from the SRU Call Out list 64 is removed and replaced. At 72, the configuration is once again updated. At 74, a test is performed again on the problematic system to determine whether the problem is fixed. At 75, once a successful repair is completed, the new Fault Signature 63 processed through the RFM Mask 62 (see FIG. 7) will be incorporated in the CFM Mask 58 at step 79. Finally at 80, the SRU Callout List 60 (from FIG. 4B) is updated This process will continue to build the CFM Mask 58 to include all new Fault Signatures 63 that are not presently in the Diagnostic Knowledge Base 12.

Exemplary BITPRO Menu Bar and Buttons Features

Figure 9:
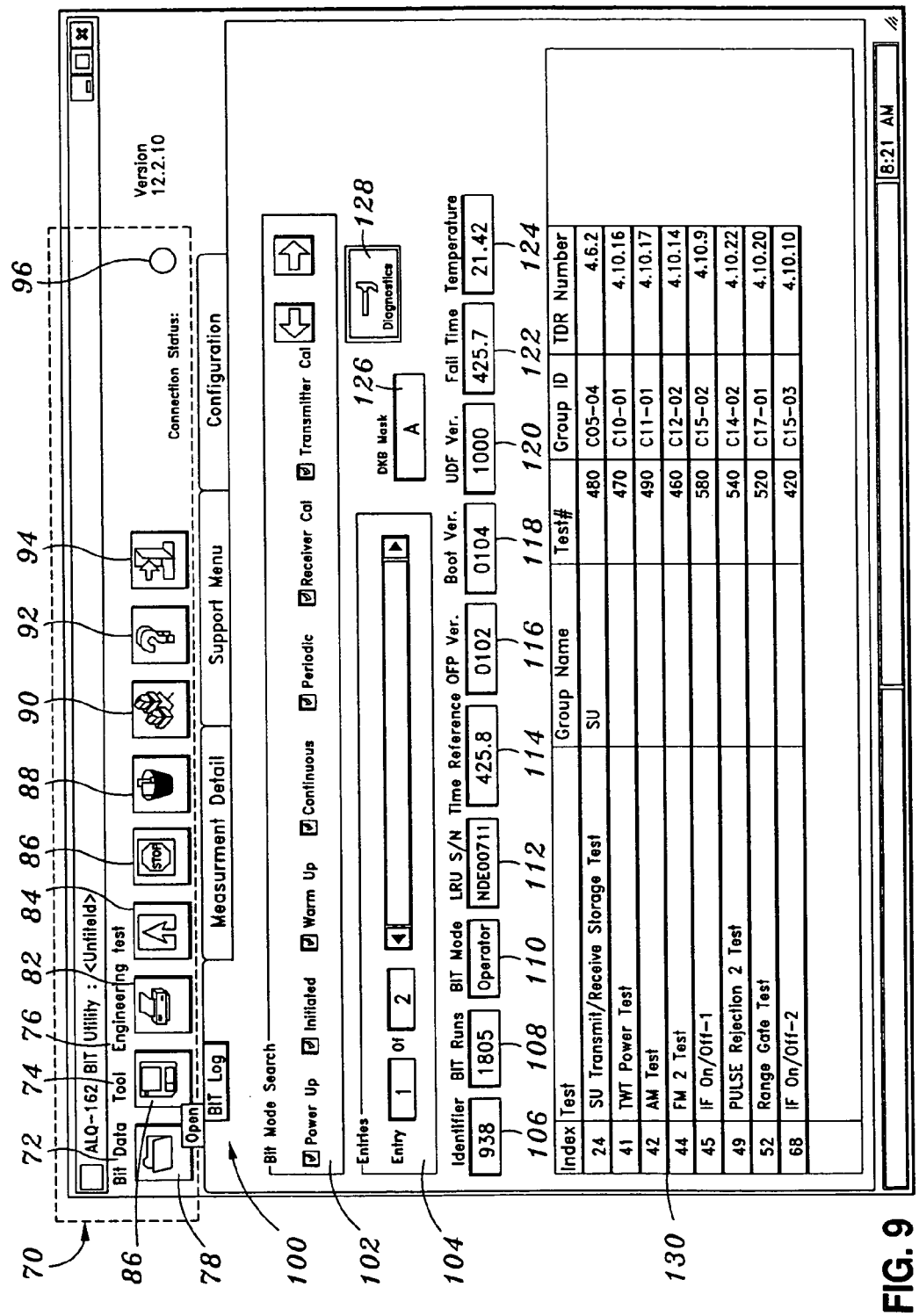
FIG. 9 is a screen shot of an exemplary BIT Log tab, according to an aspect of the present invention.

The following section will now describe numerous exemplary features of the BITPRO system 2. As shown in FIG. 9 the application includes Menu Bar and Buttons Menu 70 features which provides numerous functions. In particular, the Menu Bar includes BIT Data 72, Tools 74 and Engineering Test 76 functions/features. The BIT Data 72 includes the following functions/features: BIT Fails, Display of Failed Tests, Inhibited Tests, and Display of Inhibited Tests. The Tools 74 feature includes Data Utility (which further includes Compact Data, Import LRU Configuration, Export Database, and Import Database functions), Connect To LRU, Disconnect From LRU, and New LRU function/features. The Engineering Test 76 feature allows the user to run Initiated BIT (IBIT) at selectable intervals continuously until it is interrupted by the user. A text file is generated and data collected from each run is appended to the file. This feature is useful when running the LRU over night and collect data next morning.

The Buttons Menu includes the following functions/features: Open File 78, Save File 80, Print 82, Load BIT Log from LRU 84, Stop Loading BIT 86, Clear BIT Log 88, Communication Ports Setting 90, Help 92, and Exit Program 94. Also a Connection Status indicator 96 is provided in the upper right hand quadrant of the application screen.

An Exemplary BIT Log Tab

The BITPRO system 2 further includes a Bit Log screen or tab 100 as shown in the background of FIGS. 5 and 6 (behind display boxes), and of which is even more clearly shown in FIG. 9 (without display boxes) which includes exemplary data.

The Bit Log 100 provides numerous functions/features including a BIT Mode Selection Filter 102 which further includes various BIT modes including Power-Up, Initiated, Warm-Up, Continuous, Periodic, Receiver Calibration and Transmitter Calibration. A Number of Records/Entries 104 is provided which shows the current entry and the total number of failure records available in the LRU BIT Log; so if the BIT log has 14 entries and you are viewing number 3 it would show 3 of 14 in the two associated fields). Further features include Identifier 106 which assigns a failure number, BIT Runs 108 which counts the number of Power on BIT (PBITY) or Initiated BIT, BIT Mode at the Time of Failure 110 [e.g., PBIT, IBIT, Continuous BIT (CBIT), LRU Serial Number 112, and Time Reference 114. Moreover, OFP Version 116 is provided which writes the LRU serial number and the time reference in the memory so when BIT log data is collected for analysis the data will be attached to each BIT Log records for easier analysis. Also a BOOT Version 118, and UDF Version 120 feature is included which shows the existing BOOT version and User Data Module (UDF) version allowing the user to determine if the system needs a newer version of software). Additionally, other features include a Fail Time 122 (time reference upon failure) and Temperature 124 at the time of failure features.

When the Diagnostics Button 128 is depressed, the ALQ-162 BIT Utility initiates the diagnostic process through the diagnostic database 12 to produce the faulty SRU as shown in FIG. 6. This is accomplished by comparing the Fault Signature from the LRU BIT Log against both the Diagnostic Knowledge Database 12 and LRU Maintenance Database 14 which provides a list of potential faulty SRU(s) that generates the Fault Signature listed in the Failed Tests Table 130. It is further noted that the SRU list is linked to the related Remove/Replace Instructions in the Technical Order (TO), which represents the operation and maintenance manual.

Furthermore a Failed Tests Table 130 is provided wherein each test number I.D. is linked to a Test Description Document. The Table 130 is organized by an Index Number, Test Description, Group Name, Test Number, Group ID and TDR Number. Exemplary Test Descriptions and affiliated data are shown in FIG. 9.

An Exemplary Measurement Detail Tab

Figure 10:
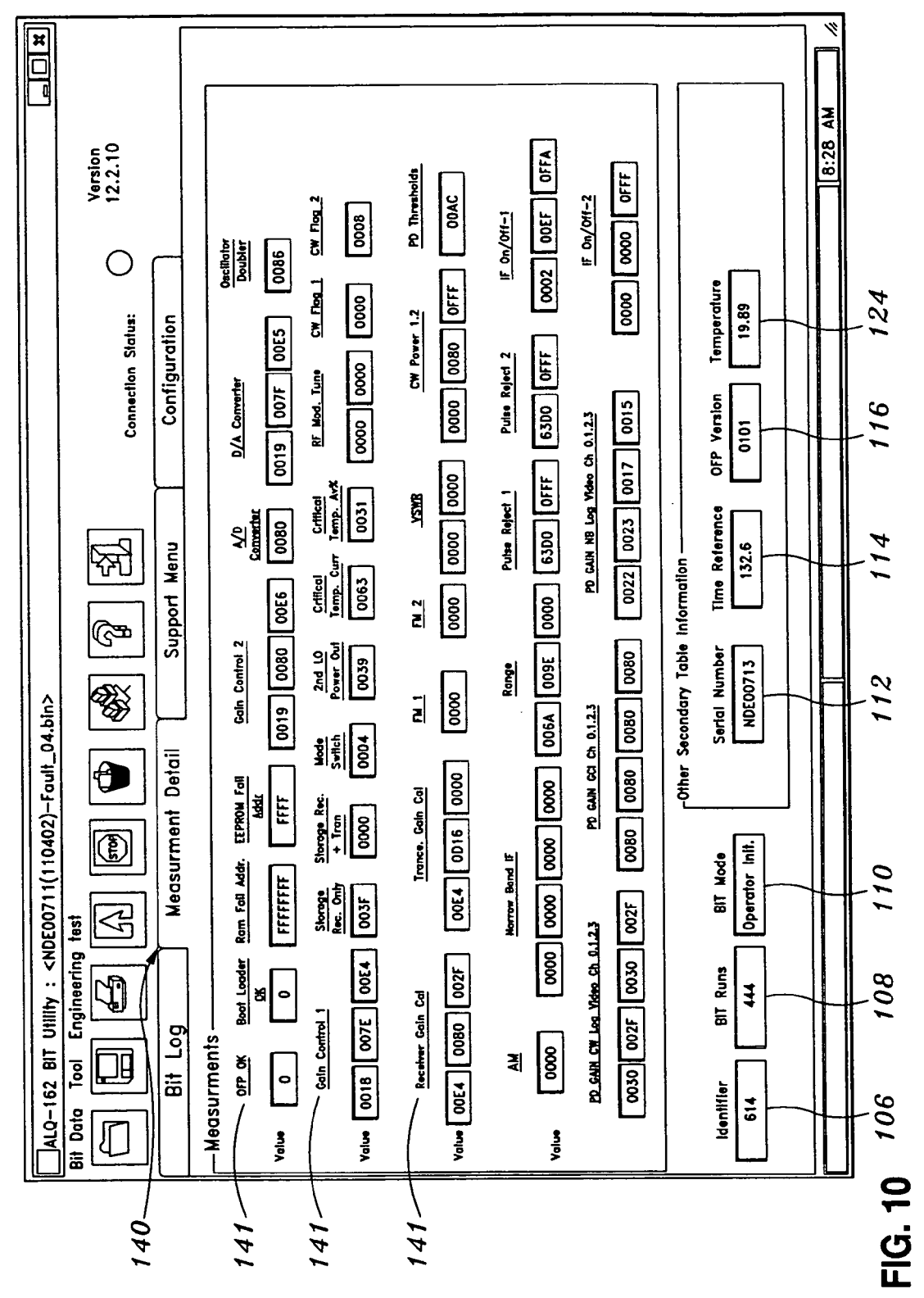

The BITPRO system 2 further includes a Measurement Detail screen or tab 140 as shown in FIG. 10 which displays all applicable measurements collected during BIT test. Any measurement data (real-time or not real-time), if relevant, may be used to resolve inconclusive fault isolation detail. In particular, the Measurement Detail screen 140 displays recorded values for the last BIT Log (see FIG. 10). The Measurement Detail screen 140 includes pass/fail status for measurements. Measurements with a yellow background indicate that the recorded value is within the acceptable limits for the test. If the value is displayed with a red background, then the value is out of range. Clicking on the Test Descriptor Function 141 name will identify test upper and lower limits and the actual value recorded. Additionally, identification information for the BIT Mode and LRU information is displayed. The lower left three boxes (Identifier, BIT Runs, BIT Mode) are normally orange; if the data has a yellow background the data shown does not match the BIT Log data selected on the BIT Log Tab display. It is noted that the Measurement Detail screen 140 may be adapted to show various data, parameters, status, measurements, ranges, values, etc. Thus, it should be recognized that FIG. 10 is merely an example of a typical Measurement Detail screen 140 and the present invention should not be limited to the specific Test Descriptor Functions 141 shown in FIG. 10.

The Measurement Detail Tab 140 further shows other system data which has already been discussed and of which is also displayed on the Bit Log tab 100. This information includes the Identifier Failure Number 106, Bit Runs 108 which counts the number of Power on BIT (PBIT) or Initiated BIT (IBIT), BIT Mode 110 [e.g., PBIT, IBIT, Continuous BIT (CBIT), etc.]. Other Secondary Table Information is also provided which includes Serial Number 112, Time Reference 114, OFP Version 116, and Temperature 124.

An Exemplary Support Menu Tab

Figure 11A:
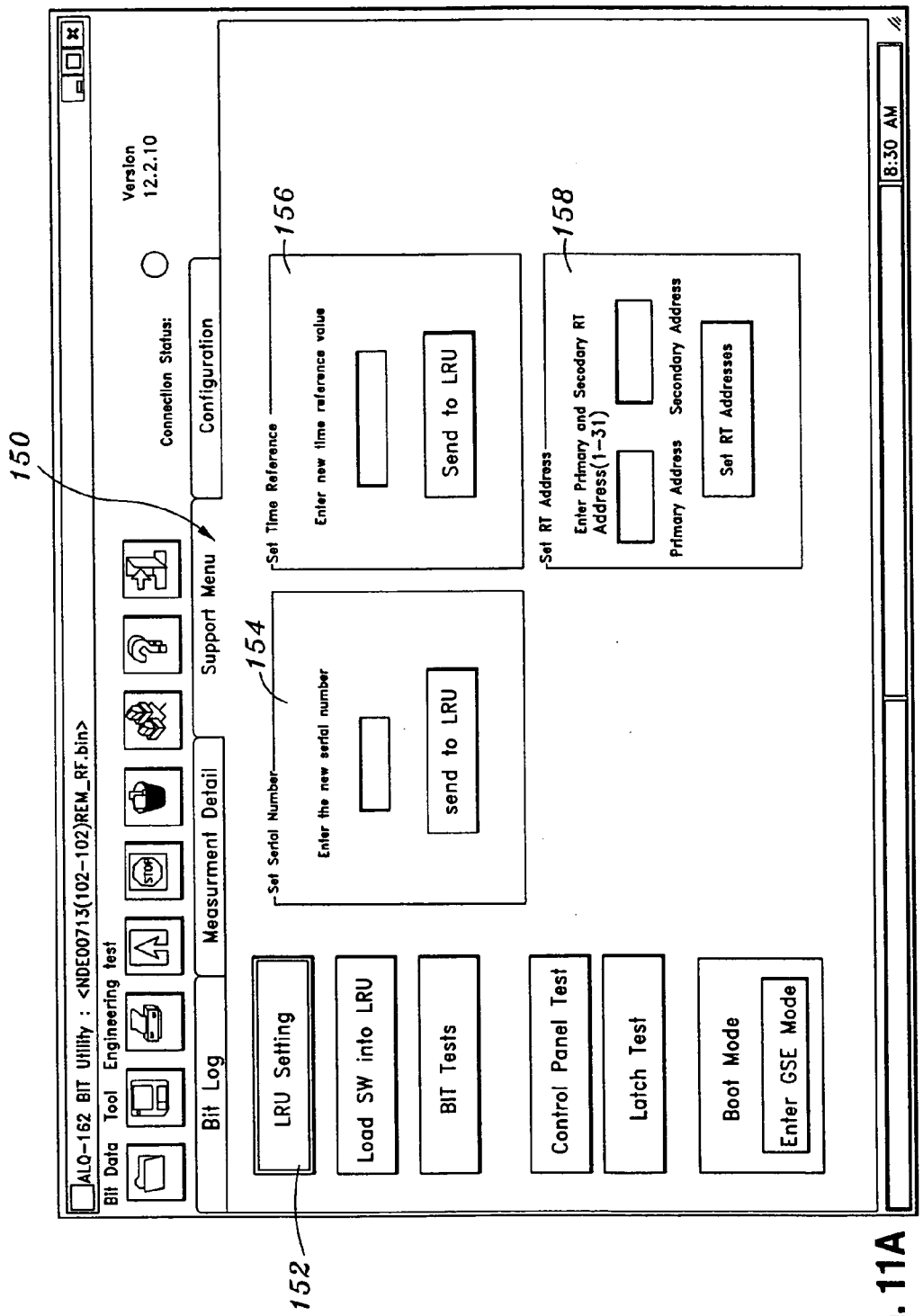
FIG. 11A is a first screen shot of an exemplary Support Menu tab, according to an aspect of the present invention.
Figure 11B:
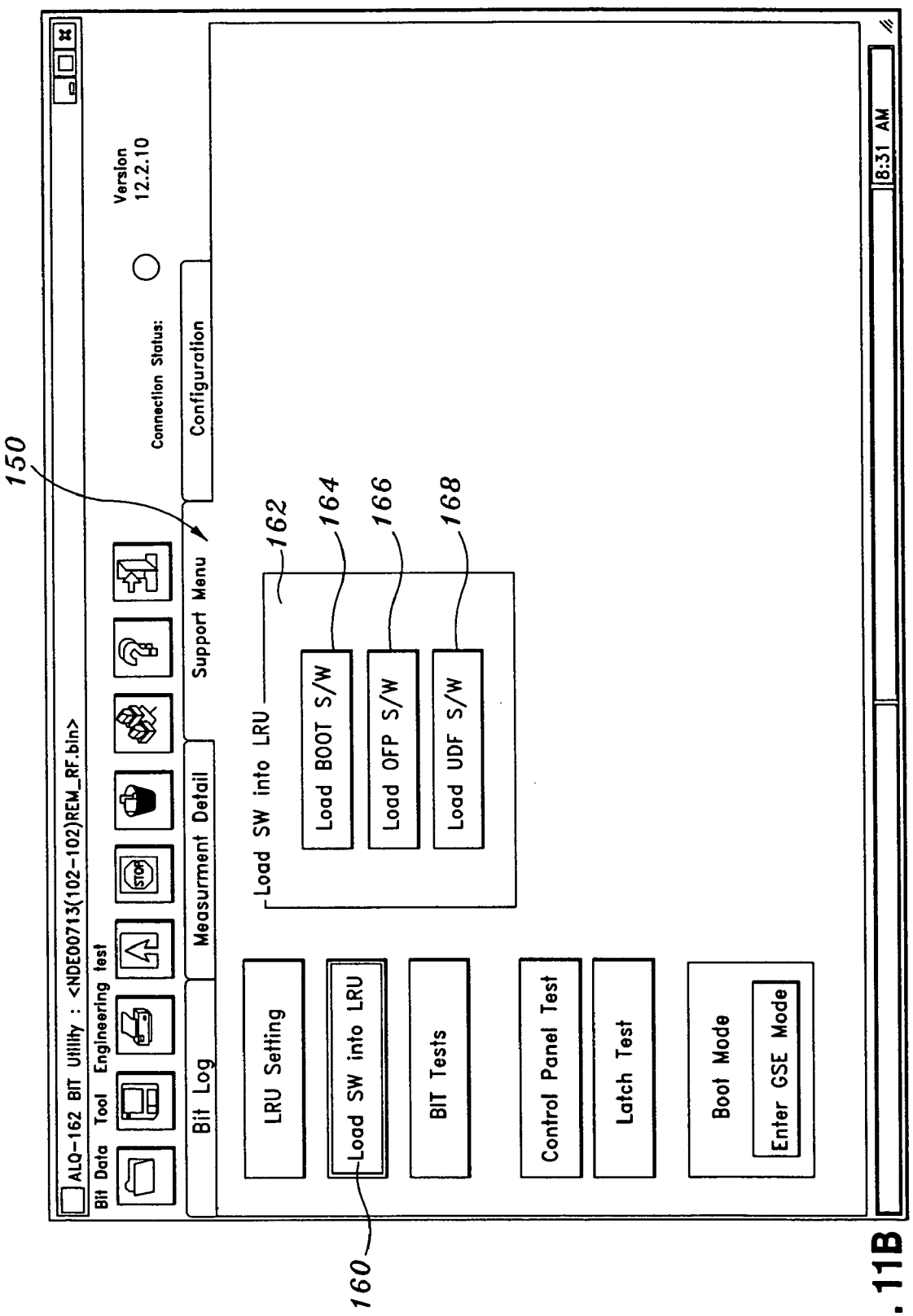
FIG. 11B is a second screen shot of the Support Menu tab, according to an aspect of the present invention.
Figure 11C:
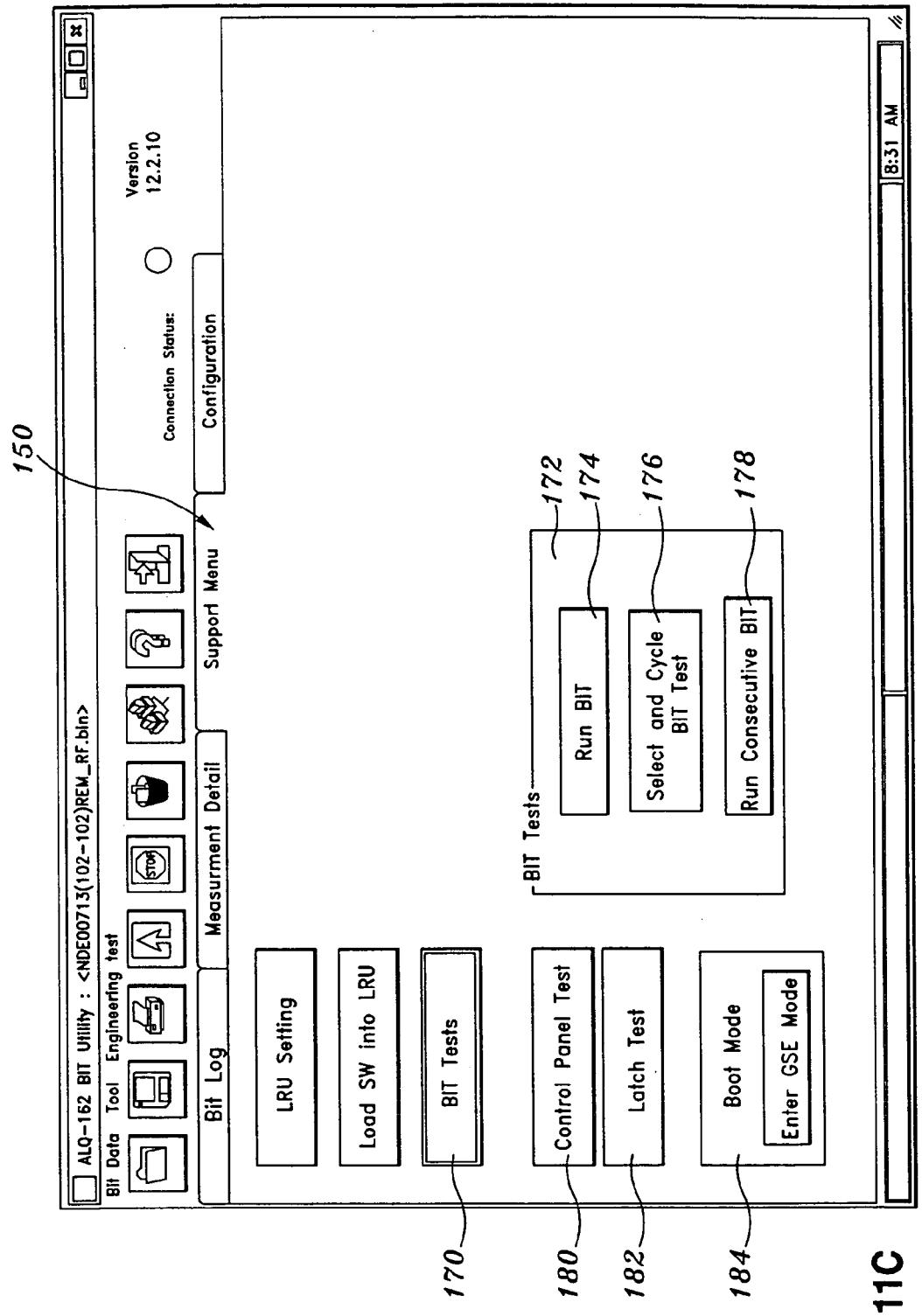
FIG. 11C is a third screen shot of the Support Menu tab, according to an aspect of the present invention.

The BITPRO system 2 further includes a Support Menu screen or tab 150 which may have a plurality of displays shown in FIGS. 11A–C which provide various support functions/features utilized with the application.

FIG. 11A is a first display of the Support Menu tab 150, according to an aspect of the present invention. At 152, an LRU Settings button is provided. When selected, a Set Serial Number box 154 for entering a new serial number is provided, a Set Time Reference box 156 is provided for entering a new time reference value, and a Set RT (Remote Terminal) Address box 158 are displayed for entering primary and secondary RT. The primary and secondary addresses are set to allow the test subject main computer (e.g., aircraft main computer which operates as a bus controller) to communicate a in a Remote Terminal (RT) mode.

FIG. 11B is a second display of the Support Menu tab 150, according to an aspect of the present invention. At 160, a Load SW into LRU button is provided. This feature provides a small menu for loading several different software programs into an LRU including OFP, BOOT, and UDF programs. At 162, a box is provided with a button for loading Boot S/W 164, Operation Flight Program (OFP) S/W 166, User Data File (UDF) S/W 168.

FIG. 11C is a third display of the Support Menu tab 150, according to an aspect of the present invention. At 170, A BIT Tests button is provided. When selected, a box 172 displaying several BIT Tests options, including Run BIT 174, Select and Cycle BIT Test 176, and Run Consecutive BIT 178 is provided. Run BIT initiates BIT test for one time; Cycle BIT is a feature that allows the user to select any BIT test and run that test for up to 255 times; and the Run Consecutive feature allow the user to run a complete BIT test up to 100 times tests.

Additionally, as shown in FIGS. 11A–C, the Support Menu tab 150 further includes a Control Panel Test 180 which initiates a series of commands that will illuminate the RCV, XMT, GO, and NO LED indicators sequentially and turn on all of them for two seconds and turn off all four indicators. This test is included in the BITPRO system 2 application because this function cannot be tested by the system BIT. Moreover, a Latch Test feature 182 is provided which tests the LRU latches. And, Boot Mode feature is provided which allows the operator to select either BOOT or OFP Modes and/or enter GSE Mode.

An Exemplary Configuration Tab

Figure 12:
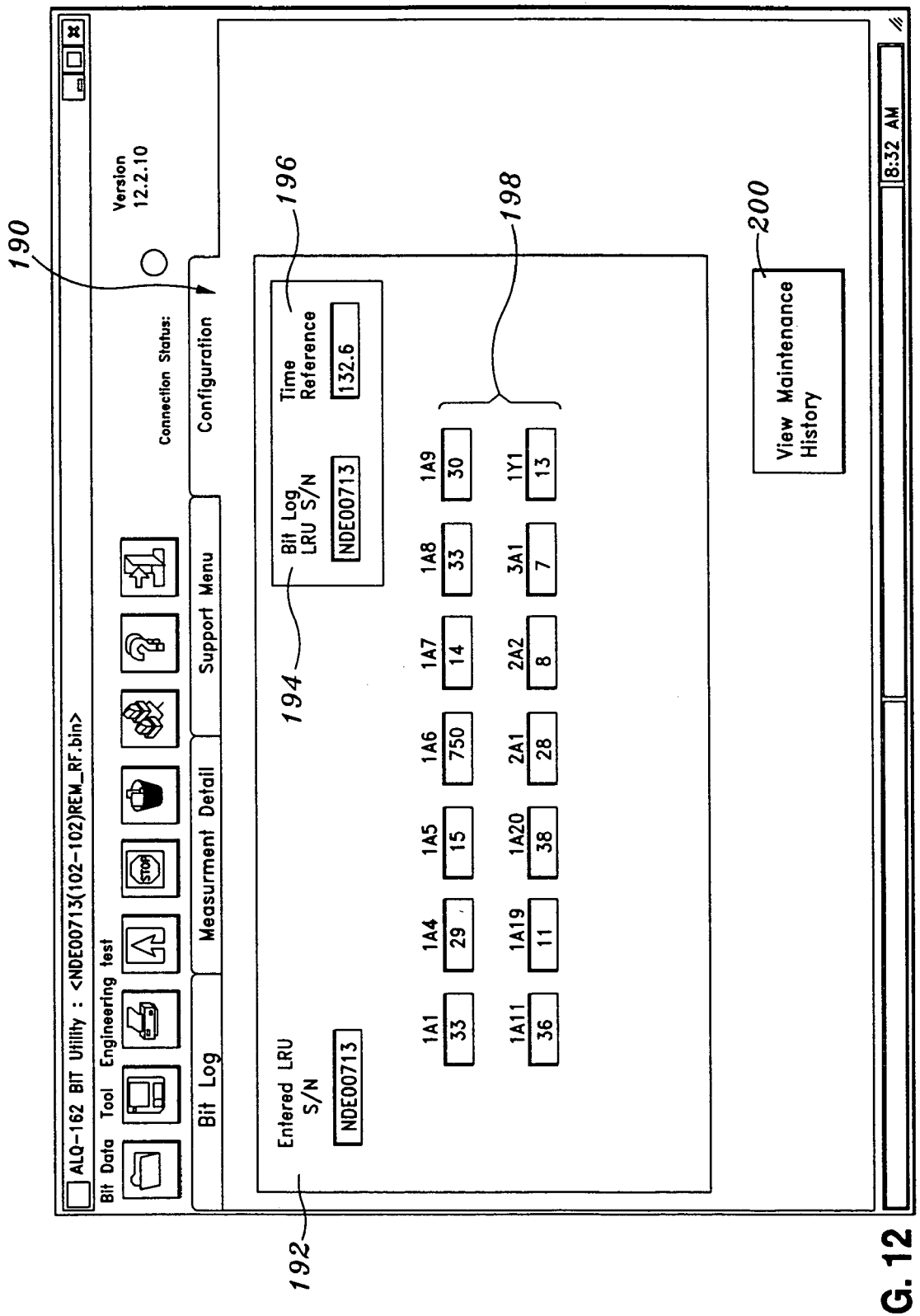
FIG. 12 is a screen shot of an exemplary Configuration tab, according to an aspect of the present invention.

The BITPRO system further includes a Configuration screen or tab 190 which is shown in FIGS. 12. At 192, the Entered LRU S/N is displayed. At 194, the Bit Log LRU S/N is displayed. At 196, the Time Reference is shown. At 198, the number of Maintenance Actions that have been performed on specific SRU's are displayed. At 200, a button is provided to View Maintenance History.

Figure 13:
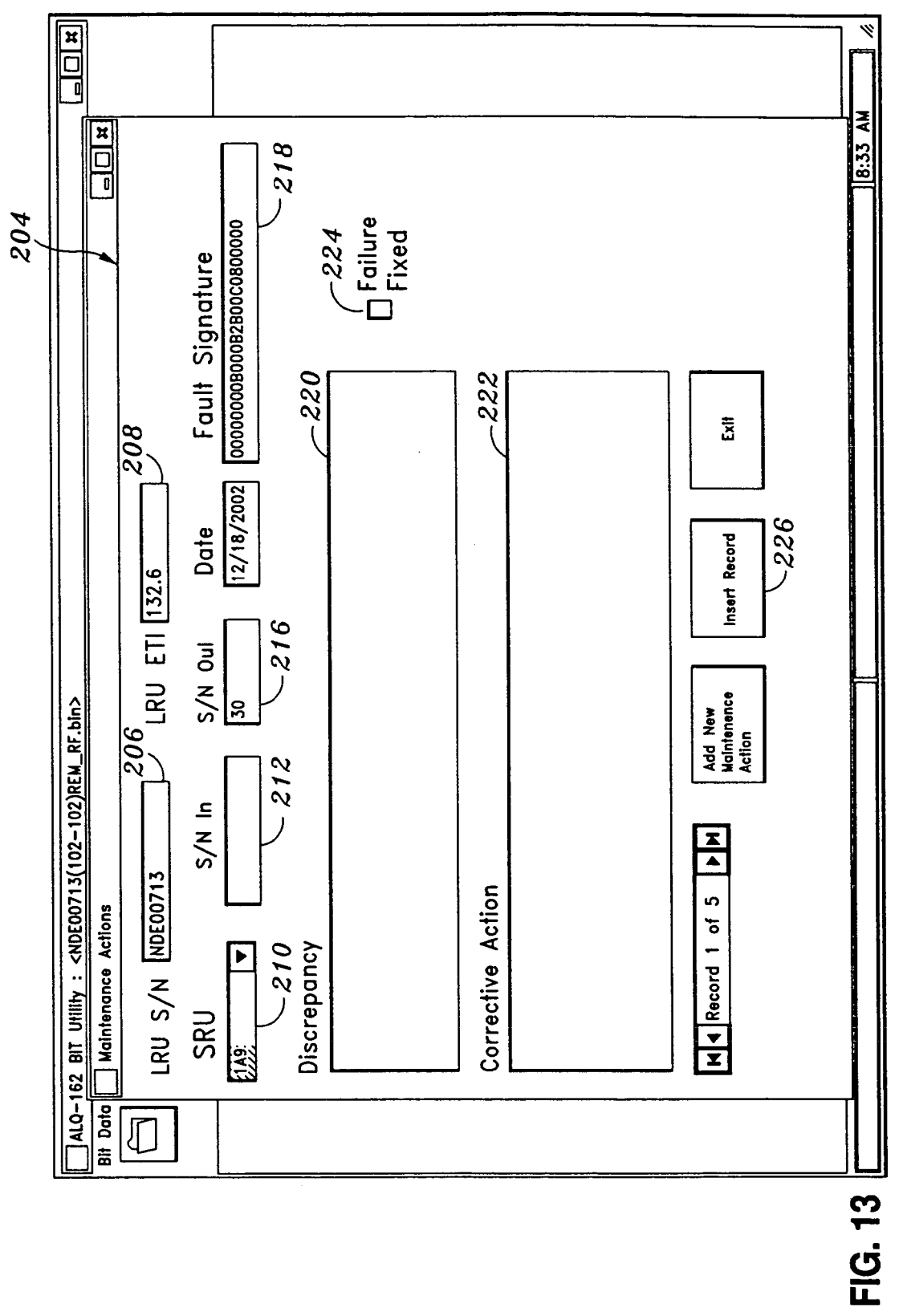

When the View Maintenance History button 200 has been selected, a Maintenance Actions screen 204 is displayed as is shown FIG. 13. This Maintenance Actions screen 204 is used to add new Maintenance Actions and to incorporate Maintenance Actions in the Diagnostic Knowledge Database 12 and/or LRU Maintenance Database 14. The Maintenance Actions screen 204 includes an LRU S/N box at 206 and LRU ETI box at 208. At 210, an SRU may be selected. At 212, S/N In shows the S/N of the SRU that is installed. At 214, S/N Out shows the S/N of the SRU removed from the system under repair. At 216, the date the removal took place is displayed. At 218, the indicated Fault Signature that was recorded is displayed. At 220, a Discrepancy box is provided for describing the problem or anomaly. At 222, a Corrective Action box is provided for describing the corrective action. At 224, a Failure Fixed box may be checked if the failure was fixed.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

In accordance with various embodiments of the present invention, the methods described herein are intended for operation as software programs running on a computer processor. Dedicated hardware implementations including, but not limited to, application specific integrated circuits, programmable logic arrays and other hardware devices can likewise be constructed to implement the methods described herein. Furthermore, alternative software implementations including, but not limited to, distributed processing or component/object distributed processing, parallel processing, or virtual machine processing can also be constructed to implement the methods described herein.

It should also be noted that the software implementations of the present invention as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories.

What is claimed is:

1. A diagnostic process for performing tests and collecting Built-In-Test (BIT) log data from systems, analyzing fault data, and recommending Shop Replaceable Units (SRU's) comprising:
   uploading and reading a retrieved fault signature from a BIT log retrieved from a subject system wider test, wherein the retrieved fault signature is a serial word composed of a plurality of consecutive bits indicating either a pass or fail, and wherein each bit is assigned to a specific SRU, system level test, or an event.

2. The diagnostic process according to claim 1, further comprising performing a Discrete Fault Mask (DFM) algorithm to determine whether a single faulty SRU can be identified.

3. The diagnostic process according to claim 2, wherein the DFM algorithm includes comparing the retrieved fault signature to a DFM Table comprising a list of predetermined fault signatures each representing an unambiguous test correlated to specific SRU failure.

4. The diagnostic process according so claim 3, wherein each predetermined fault signature representing an unambiguous test is encoded with a differing bit at a unique bit position in the predetermined fault signature.

5. The diagnostic process according to claim 3, wherein if a matching bit is found between the retrieved fault signature and one of the predetermined fault signatures from the DFM Table, the SRU correlated to the unambiguous test with the matching bit is identified as the cause of the failure.

6. The diagnostic process according so claim 2, further comprising performing a Combinational Fault Mask (CFM) algorithm to identify a list of potentially problematic SRU's if a matching bit is not found after the DFM algorithm is performed.

7. The diagnostic process according to claim 6, wherein the CFM algorithm includes comparing the retrieved fault signature to a CFM Table comprising a list of CFM serial words composed of a plurality of consecutive bits indicating either a pass or fail, and wherein each bit is assigned to a specific SRU, system level test, or an event.

8. The diagnostic process according to claim 7, wherein each CFM serial word represents an ambiguous test which includes a combination of passing and failing tests and wherein each ambiguous test is correlated to at least one SRU.

9. The diagnostic process according to claim 8, wherein each CFM serial word representing an unambiguous test is encoded with differing bits at unique bit positions representative of the passing and failing tests.

10. The diagnostic process according to claim 9, further comprising comparing the retrieved fault signature to each ambiguous test to determine if the bits from the retrieved fault signature match the bits from one of the ambiguous tests.

11. The diagnostic process according to claim 10, wherein if the bits from the retrieved fault signature match the bits from one of the ambiguous tests, the identified list of potentially problematic SRU's is generated from the at least one SRU's correlated to selected ambiguous test.

12. The diagnostic process according to claim 11, wherein the correlated SRU's are ranked according to the probability of each respective SRU's chance of being a problematic SRU.

13. The diagnostic process according to claim 7, further comprising performing a Reserved Fault Mask (RFM) algorithm to identify a list of potentially problematic SRU's if matching bits are not found between the retrieved fault signature and the list of CFM serial words representing the ambiguous tests.

14. The diagnostic process according to claim 13, wherein the RFM algorithm includes comparing the retrieved fault signature to a RFM comprising a plurality of functional elements.

15. The diagnostic process according to claim 14, wherein each functional element is composed of a serial word comprising a plurality of consecutive bits indicating either a pass or fail, and wherein each bit is assigned to an indexed test.

16. The diagnostic process according to claim 15, further comprising updating the CFM Table with a new CFM serial word representative of a new ambiguous test derived from a new fault signature.

17. The diagnostic process according to claim 16, wherein the new fault signature is derived from the indexed tests from the RFM algorithm which were correlated to failed tests from the retrieved fault signature.

18. The diagnostic process according to claim 14, wherein each functional element is any component or group of components that can perform a unique function that produces a unique fault signature within a specific SRU.

19. The diagnostic process according to claim 14, wherein each SRU is represented by a plurality of functional elements.

20. The diagnostic process according to claim 14, further comprising comparing the retrieved fault signature to each functional element in the RFM Table.

21. The diagnostic process according to claim 20, further comprising establishing a fail to use ratio for each functional element.

22. The diagnostic process according to claim 21, wherein the identified list of potentially problematic SRU's is generated by ranking SRU's having the highest fail to use ratio's.

23. A computer readable medium storing a computer program that provides a system for performing tests and collecting Built-In-Test (BIT) log data from systems, analyzing fault data, and recommending Shop Replaceable Units (SRU's), the medium comprising:
 a source code segment for uploading and reading a retrieved fault signature from a BIT log retrieved from a system under test, wherein the retrieved fault signature is a serial word composed of a plurality of consecutive bits indicating either a pass or fail, and wherein each bit is assigned to a specific SRU, system level test, or an event;
 a source code segment for performing a Discrete Fault Mask (DFM) algorithm to determine whether a single faulty SRU can be identified;
 a source code segment for performing a Combinational Fault Mask (CFM) algorithm to identify a list of potentially problematic SRU's if a matching bit is not found after the DFM algorithm is performed; and
 a source code segment for performing a Reserved Fault Mask (RFM) algorithm to identify a list of potentially problematic SRU's if matching bits are not found between the retrieved fault signature and the list of CFM serial words representing ambiguous tests.

24. The medium according to claim 23, wherein the DFM algorithm includes comparing the retrieved fault signature to a DFM Table comprising a list of predetermined fault signatures each representing an unambiguous test correlated to specific SRU failure.

25. The medium according to claim 24, wherein each predetermined fault signature representing an unambiguous test is encoded with a differing bit at a unique bit position in the predetermined fault signature.

26. The medium according to claim 25, wherein if a matching bit is found between the retrieved fault signature and one of the predetermined fault signatures from the DFM Table, the SRU correlated to the unambiguous test with the matching bit is identified as the cause of the failure.

27. The medium according to claim 26, wherein the CFM algorithm includes comparing the retrieved fault signature to a CFM Table comprising a list of CFM serial words composed of a plurality of consecutive bits indicating either a pass or fail, and wherein each bit is assigned to a specific SRU, system level test, or an event.

28. The medium according to claim 27, wherein each CFM serial word represents an ambiguous test which includes a combination of passing and failing tests and wherein each ambiguous test is correlated to at least one SRU.

29. The medium according to claim 28, wherein each CFM serial word representing an unambiguous test is encoded with differing bits at unique bit positions representative of the passing and failing tests.

30. The medium according to claim 29, further comprising comparing the retrieved fault signature to each ambiguous test to determine if the bits from the retrieved fault signature match the bits from one of the ambiguous tests.

31. The medium according to claim 30, wherein if the bits from the retrieved fault signature match the bits from one of the ambiguous tests, the identified list of potentially problematic SRU's is generated from the at least one SRU's correlated to selected ambiguous test.

32. The medium according to claim 31, wherein the correlated SRU's are ranked according to the probability each respective SRU's chance of being a problematic SRU.

33. The medium according to claim 23, wherein the RFM algorithm includes comparing the retrieved fault signature to a RFM Table comprising a plurality of functional elements.

34. The medium according to claim 33, wherein each functional element is composed of a serial word comprising a plurality of consecutive bits indicating either a pass or fail, and wherein each bit is assigned to an indexed test.

35. The medium according to claim 33, wherein each functional element is any component or group of components that can perform a unique function that produces a unique fault signature within a specific SRU.

36. The medium according to claim 33, further comprising comparing the retrieved fault signature to each functional element in the RFM Table.

37. The medium according to claim 33, further comprising establishing a fail to use ratio for each functional element.

38. The medium according to claim 23, wherein each SRU is represented by a plurality of functional elements.

39. The medium according to claim 23, wherein the identified list of potentially problematic SRU's is generated by ranking SRU's having the highest fail to use ratio's.

40. The medium according to claim 23, comprising a source code segment for updating the CFM Table with a new CFM serial word representative of a new ambiguous test derived from a new fault signature.

41. The medium according to claim 40, wherein the new fault signature is derived from the indexed tests from the RFM algorithm which were correlated to failed tests from the retrieved fault signature.

42. A system for performing tests and collecting Built-In-Test (BIT) log data from systems, analyzing fault data, and recommending Shop Replaceable Units (SRU's), the system comprising:

a computer with memory;

an interface test adapter in communication with the personal computer;

a cable set in communication with the interface test adaptor, wherein the cable set is adapted to be connected to a subject test system;

a source code segment stored within memory of the computer for performing a Discrete Fault Mask (DFM) algorithm to determine whether a single faulty SRU can be identified;

a source code segment stored within memory of the computer for performing a Combinational Fault Mask (CFM) algorithm to identify a list of potentially problematic SRU's if a matching bit is not found after the DFM algorithm is performed;

a source code segment stored within memory of the computer for performing a Reserved Fault Mask (RFM) algorithm to identify a list of potentially problematic SRU's if matching bits are not found between the retrieved fault signature and the list of CFM serial words representing ambiguous tests; and a Diagnostic Database stored within memory of the computer which includes a DFM Table, a CFM Table and a RSM Table.

43. The system according to claim 42, further comprising, a source code segment stored within memory which provides a BIT Log user interface for displaying output data and receiving input data;

a source code segment stored within memory which provides a Measurement Detail user interface displaying output data and receiving input data;

a source code segment stored within memory which provides a Support Menu user interface displaying output data and receiving input data; and a source code segment stored within memory which provides a Configuration user interface displaying output data and receiving input data.

* * * * *